United States Patent
Capriotti et al.

[11] Patent Number: 5,910,774
[45] Date of Patent: Jun. 8, 1999

[54] SENSOR FOR COUNT AND TAMPER DETECTION

[75] Inventors: Roberto Capriotti, Farmington; Mizanur Rahman, Minneapolis, both of Minn.

[73] Assignee: Itron, Inc., Spokane, Wash.

[21] Appl. No.: 08/928,839

[22] Filed: Sep. 12, 1997

Related U.S. Application Data

[60] Provisional application No. 60/026,277, Sep. 18, 1996.

[51] Int. Cl.$^6$ ................................................. G08B 21/00
[52] U.S. Cl. ...................... 340/637; 340/568.1; 340/657; 324/110; 324/142
[58] Field of Search ..................... 340/635, 637, 340/657, 568.1, 870.02; 324/110, 142

[56] References Cited

U.S. PATENT DOCUMENTS

| | | | |
|---|---|---|---|
| 3,915,112 | 10/1975 | Forester | 324/110 |
| 4,150,371 | 4/1979 | Scaglione | 340/568 |
| 4,331,915 | 5/1982 | Fielden | 324/110 |
| 4,357,601 | 11/1982 | McWilliams | 340/870.02 |
| 4,359,685 | 11/1982 | Eguchi et al. | 324/174 |
| 4,429,276 | 1/1984 | Narimatsu et al. | 340/870.38 |
| 4,504,787 | 3/1985 | Planer | 324/142 |
| 4,532,600 | 7/1985 | Mihara et al. | 324/166 |
| 4,707,679 | 11/1987 | Kennon et al. | 340/870.02 |
| 4,833,455 | 5/1989 | Bishop | 340/568 |
| 5,017,877 | 5/1991 | Haus, Jr. | 340/637 |
| 5,086,292 | 2/1992 | Johnson et al. | 340/637 |
| 5,227,668 | 7/1993 | Mutch et al. | 324/110 |
| 5,293,115 | 3/1994 | Swanson | 340/637 |
| 5,351,005 | 9/1994 | Rouse et al. | 324/252 |
| 5,473,322 | 12/1995 | Carney | 340/870.02 |
| 5,486,755 | 1/1996 | Horan | 324/110 |
| 5,488,565 | 1/1996 | Kennon et al. | 324/110 |
| 5,553,094 | 9/1996 | Johnson et al. | 375/200 |
| 5,559,894 | 9/1996 | Lubliner et al. | 324/110 |
| 5,648,885 | 7/1997 | Nishiokan et al. | 324/252 |

Primary Examiner—Daniel J. Wu
Attorney, Agent, or Firm—Patterson & Keough, P.A.

[57] ABSTRACT

A sensor assembly and method of forming the sensor assembly for sensing count and tamper, where the count is related to an energy field having a gradient along an axis of sensitivity and where the tamper is related to a static energy field and where the energy comprising the static energy field is the same type as the energy comprising the energy field having a gradient, includes an energy gradient detector that has at least a first sensor spaced apart from and communicably coupled to a second sensor along the axis of sensitivity. A static energy detector that has at least a first shielded sensor, the shielded sensor being substantially shielded from the energy field having a gradient and from the static energy field. A second unshielded sensor is communicably coupled to the shielded sensor. The invention further includes a method of detecting a spatially varying magnetic field.

29 Claims, 7 Drawing Sheets

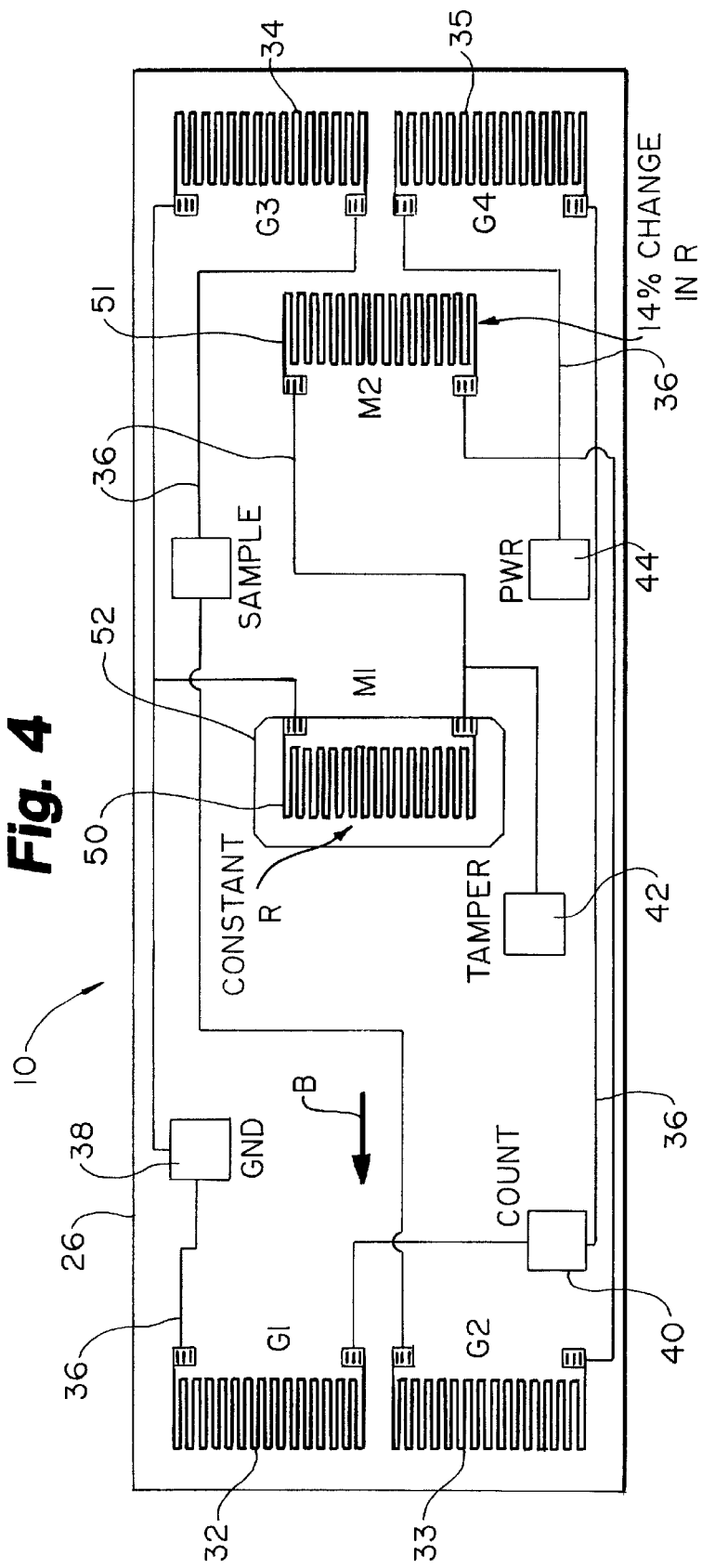

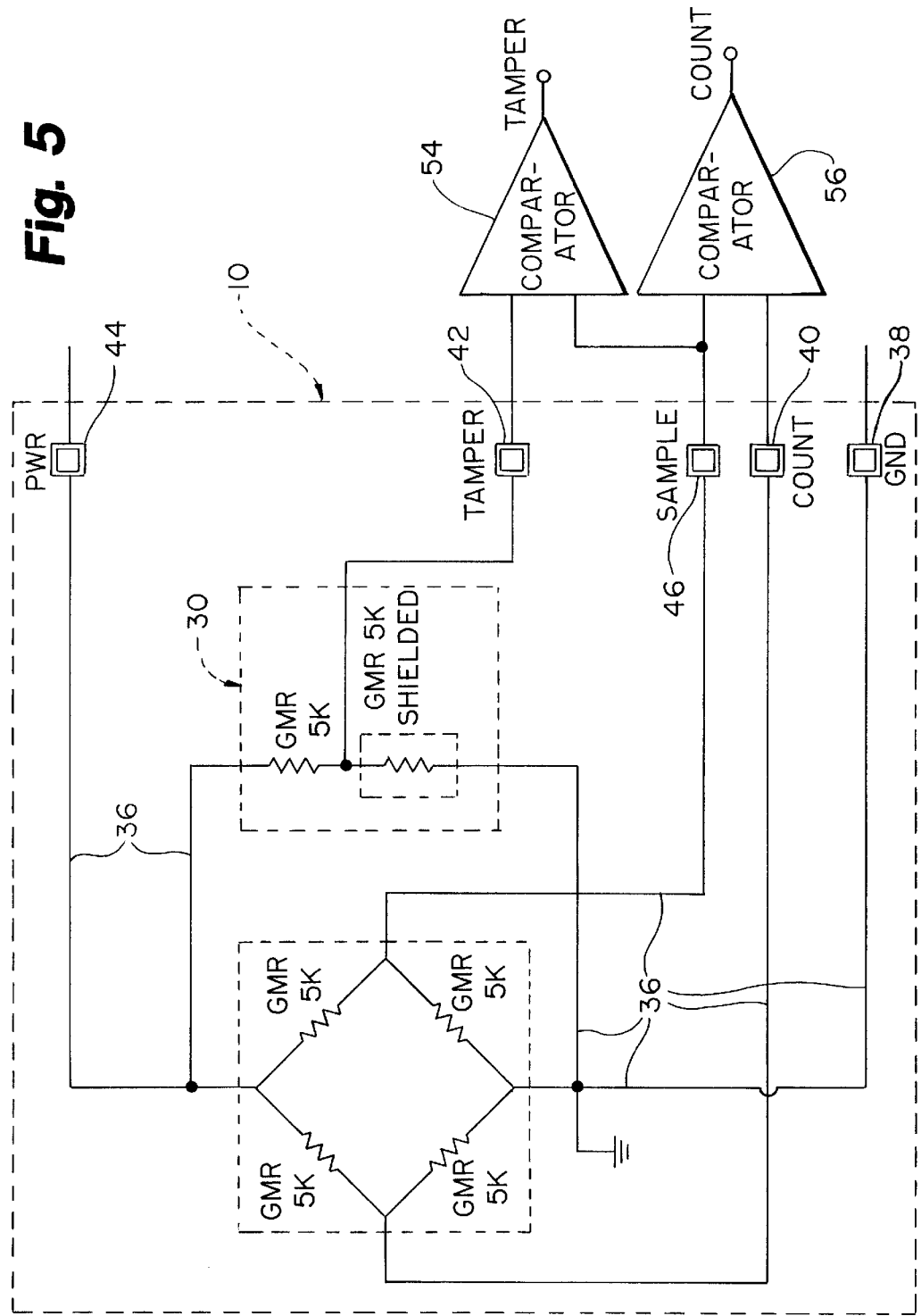

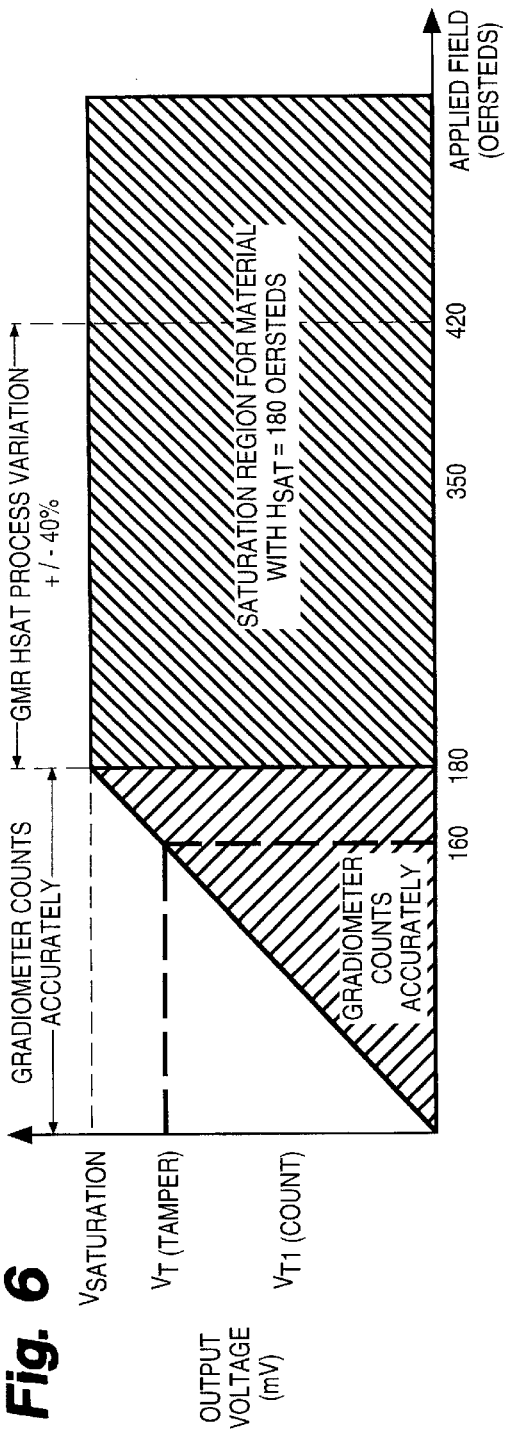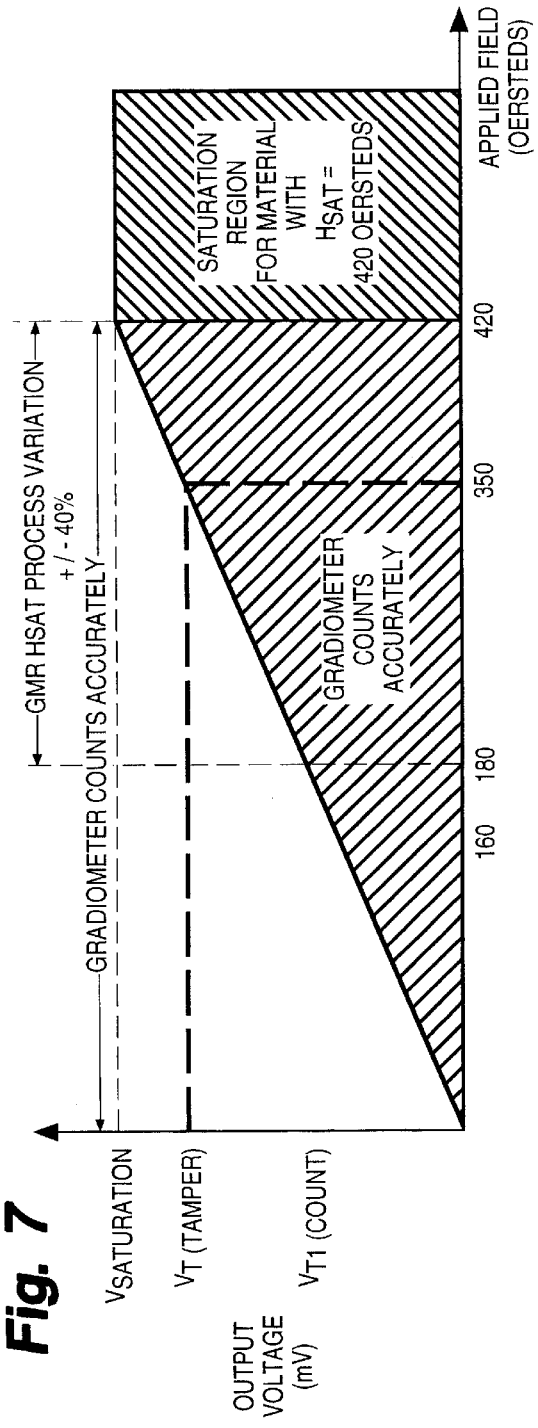

SENSOR FOR COUNT AND TAMPER DETECTION

RELATED APPLICATIONS

The present application claims the benefit of and incorporates by reference U.S. Provisional Patent Application No. 60/026,277, filed Sep. 18, 1996, entitled GMR SENSOR FOR COUNT AND TAMPER DETECTION.

TECHNICAL

The present invention relates to a method and sensor assembly for sensing a gradiated energy field in the presence of a relatively large static tamper field of the same energy. More particularly, the present invention may utilize the giant magnetoresistive ratio (GMR) effect of a sensor for both count and tamper detection in the sensor assembly. The invention further includes a method of forming the sensor assembly.

BACKGROUND OF THE INVENTION

Utility meters are used for billing commodities provided by public utilities such as power, gas, and water. For example, watt-hour meters, located at the customer premises, include meter units for measuring and recording electric power consumption by the customer. Typically, an induction-type watt-hour meter is provided at each customer location. The induction-type watt-hour meter operates on a principle of a rotating magnetic field of an induction motor. Electric power service is routed through the meter in a manner causing a metallic disk to rotate at a rate proportional to power consumption. Disk rotation is counted and recorded mechanically using a mechanical kilowatt hour register and/or electronically with data stored in a conventional semiconductor memory.

In such systems, there is the possibility that a dishonest customer will tamper with the meter to indicate a lower rate of consumption, resulting in an improperly low gas or electric bill. Numerous ingenious methods and devices have been devised by dishonest customers to cheat on such bills. A frequently used method of tamper is to impose a strong static energy field on the meter that is of the same type of energy as the field of energy being counted by the meter. With the aforementioned watt-hour meter, a way to affect the count related to consumption is to impose a magnetic field proximate the meter. It is desirable for such a meter to accurately count the consumption of the commodity and to detect tampering with the meter.

Presently, the most widely used means of counting is performed by using a small magnet embedded at the radius of a rotating shaft which is part of the mechanical function of the meter. A magnetic reed switch positioned near the shaft provides a low power sensor to count the rotation. One of the drawbacks of using a magnetic reed switch in this application is the relatively high level of handling required in volume production of meters. The reed switches typically are two contact metal strips sealed in a slender glass tube that is approximately one half inch in length. This package cannot be easily utilized in auto-place robotic assembly. Additionally, the magnetic reed switches are prone to variations in switching fields which can require additional quality/performance checks to be performed.

In the past, a number of magnetic tamper device, sensors have been used in utility meters. Such sensors have always been placed at a location within the meter that is remote from the count sensor. Detection of magnetic tamper is more accurately sensed in the closest proximxity to the site in the meter that the counting is sensed, rather than at a location that is spatially distant from the site of the count detection. In the past, the selection of a remote location for the tamper sensor has been an engineering compromise. The problem with existing tamper sensors is being able to place the count and tamper sensors in close proximity without the tamper sensor responding to the count actuating magnet. Responses by the tamper sensor to the count actuating magnet result in "false" tamper detections. It is highly undesirable to have a high percentage of "false" tamper detections. Such detections defeat the initial intent of a tamper sensor and result in costly trips for personnel into the field to respond to "false" tamper detections. Placing the tamper sensor at a location far enough from the count sensor location in the meter for the tamper sensor to be relatively immune from "false" tamper detections resulting from sensing the rotating magnetic field typically results in placement of the tamper sensor in a position in which actual tampers may not be detected.

Real world count and tamper sensors have tolerances that must be accounted for. These tolerances arise during the manufacture of such sensors. Accordingly, a production lot of count sensors, the entire lot ostensibly being identically produced, will also have a range of count thresholds. Similarly, a production lot of tamper sensors will have a range of tamper thresholds. The range of possible thresholds for both the count and tamper sensors must be taken into account in design of the sensor. It is virtually impossible with existing reed switch counting sensors to be able to detect all counts and all tamper situations without generating any false tamper detections.

Even solid state sensor devices are not immune form tolerance differences. For example, solid state devices are typically formed in layers on a disc of silicon substrate. The disc may be four to eight inches in diameter. Hundreds of nominally identical solid state devices are formed on the same silicon disc. The individual layers that extend across the full surface of the disc are typically formed by sputtering or similar techniques. The target for the sputtering application is the center of the silicon disc. As the sputtered deposition extends radially outward from the target center, there are variations in the layer that is deposited. These variations in the deposition layer result in tolerance differences between a sensor that was formed close to the target and a sensor that was formed close to the periphery of the disc.

Because of the aforementioned tolerances and the fact that nominally identical sensors are randomly selected for inclusion in a sensor assembly, there virtually always exists a condition where a tamper has occurred and has not been detected or a false tamper has been detected. FIG. 1 depicts this prior art situation. The tolerance variation typically results in the ± forty percent that is noted. The output voltage of any given sensor is depicted along the ordinate and the applied field (in this case a magnetic field) that is seen by the sensors is depicted along the abscissa. Selecting sensors at random results in either an overlap in sensor detection by the count and tamper sensors resulting on false tamper detections in the region between $H_4$–$H_5$ or in a gap between the count and tamper thresholds in the region between $H_3$–$H_4$ in which actual tamper conditions will not be detected.

FIG. 2 illustrates the prior art situation in which the influence of the static field causes a certain percentage of sensors in the indicated band to detect neither a count nor a tamper. The graph in the upper portion of FIG. 2 depicts sensor response in a manner that is similar to that of FIG. 1. A gradient field is depicted below the graph depicting a gradient field through $2\pi$ or 360° of rotation. The gradient field to the left is without the influence of a static tamper field. The effect of the imposition of the tamper field is to shift the gradient field to the right as indicated in the rightmost gradient field depiction. The minimum point on the gradient field is greater than the maximum count detection threshold $H_2$ resulting in no count.

In the past, the tolerance variation of the individual sensors used for the count detector and for the tamper detector, though nominally having identical characteristics, resulted in the rejection of many sensors, for their individual tolerances were not compatible for use as count detectors and tamper detectors. This yield rate for sensor assemblies utilizing such randomly selected sensors was unacceptably low.

Magnetometers and other magnetic sensing devices are used extensively in many kinds of systems including magnetic disk memories and magnetic tape storage systems of various kinds. Such devices provide output signals representing the magnetic fields sensed thereby in a variety of situations.

Magnetometers can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

In the recent past, reducing the thicknesses of the ferromagnetic thin-films and the intermediate layers in extended "sandwich" structures having additional alternating ones of such films and layers, i.e, superlattices, have been shown to lead to a "giant magnetoresistive ratio effect" being present. This effect yields a magnetoresistive response which can be in the range of up to an order of magnitude greater than that due to the well-known anisotropic magnetoresistive response.

The resistance in the plane of a ferromagnetic thin-film is isotropic with respect to the giant magnetoresistive ratio effect rather than depending on the direction of a sensing current therethrough as for the anisotropic magnetoresistive effect. The giant magnetoresistive ratio effect has a magnetization dependent component of resistance that varies with the angle between magnetizations in the two ferromagnetic thin-films on either side of an intermediate layer. In the giant magnetoresistive ratio effect, the electrical resistance through the "sandwich" or superlattice is lower if the magnetizations in the two separated ferromagnetic thin-films are parallel than it is if these magnetizations are antiparallel, i.e., directed in opposing directions. Further, the anisotropic magnetoresistive effect in very thin-films is considerably reduced from bulk values therefor in thicker films due to surface scattering, whereas very thin-films are a fundamental requirement to obtain a significant giant magnetoresistive ratio effect.

In addition, the giant magnetoresistive ratio effect can be increased by adding further alternate intermediate and ferromagnetic thin-film layers to extend a "sandwich" or superlattice structure. The giant magnetoresistive ratio effect is sometimes called the "spin valve effect" in view of the explanation that a larger fraction of conduction electrons are allowed to move more freely from one ferromagnetic thin-film layer to another if the magnetizations in these layers are parallel than if they are antiparallel with the result that the magnetization states of the layers act as sort of a valve.

There is a need in the industry to provide the following improvements to a meter:

(1) Autoplacement, e.g. robotic placement, of a sensor or sensors onto a circuit board;
(2) Providing count and magnetic tamper detection at substantially the same location within the meter;
(3) Provide an "overlap" in tolerances of the count and tamper detector without setting false tamper alarms;
(4) Provide an "overlap" in tolerances of the count and tamper detector without missing any actual magnetic tamper;
(5) Improve the manufacturing yield of the sensor; and
(6) Provide a gradiometer count sensor that will continue to count until the device reaches saturation.

SUMMARY OF THE INVENTION

The present invention substantially meets the aforementioned needs of the industry. The present invention utilizes both a static energy field sensor (a magnetometer) and a gradient energy field sensor (a gradiometer). A magnetometer is a sensor for measurement of a magnetic field intensity. A gradiometer is a specialized magnetometer for sensing the gradient of a magnetic field. Additionally, in a preferred embodiment the present invention utilizes a magnetometer and a gradiometer exhibiting the Giant Magnetoresistive Ratio (GMR) effect. More broadly, the present invention utilizes a gradient energy sensor to detect a count and a static energy sensor to sense a tamper, where the energy sensed by the gradient energy sensor is the same energy as the energy sensed by the static energy sensor. For example, the gradient and static sensors could be optical sensors in the presence of light energy. Additionally, Hall effect sensors may be used, $V_H$, the Hall voltage being proportional to B, the magnetic field, (for a given current I).

The present invention is a sensor assembly for sensing count and tamper, where the count is related to an energy field having a gradient along an axis of sensitivity and where the tamper is related to a static energy field, and where the energy comprising the static energy field is the same type as the energy comprising the energy field having a gradient. The sensor assembly includes an energy gradient detector that has at least a first sensor spaced apart from and communicably coupled to a second sensor along the axis of sensitivity. A static energy detector that has at least a first shielded sensor, the shielded sensor being substantially shielded from the energy field having a gradient and from the static energy field. A second unshielded sensor is communicably coupled to the shielded sensor.

BRIEF DESCRIPTION OF THE DRAWINGS

FIG. 4 is a top planform view of the count and tamper sensor assembly of the present invention disposed on a substrate where the count sensors are disposed in a bridge layout;

FIG. 5 is a circuit diagram of the sensor assembly of FIG. 4;

FIG. 6 is a graph of the count and tamper detectors of the present invention comparing voltage and magnetic field wherein saturation of both the count and tamper detector occurs at a magnetic field of 180 Gauss;

FIG. 7 is a graph of the count and tamper detectors of the present invention comparing voltage and magnetic field wherein the saturation point of both the count and tamper detector occurs at a magnetic field of 420 Gauss.

DETAILED DESCRIPTION OF THE DRAWINGS

Figure 1:
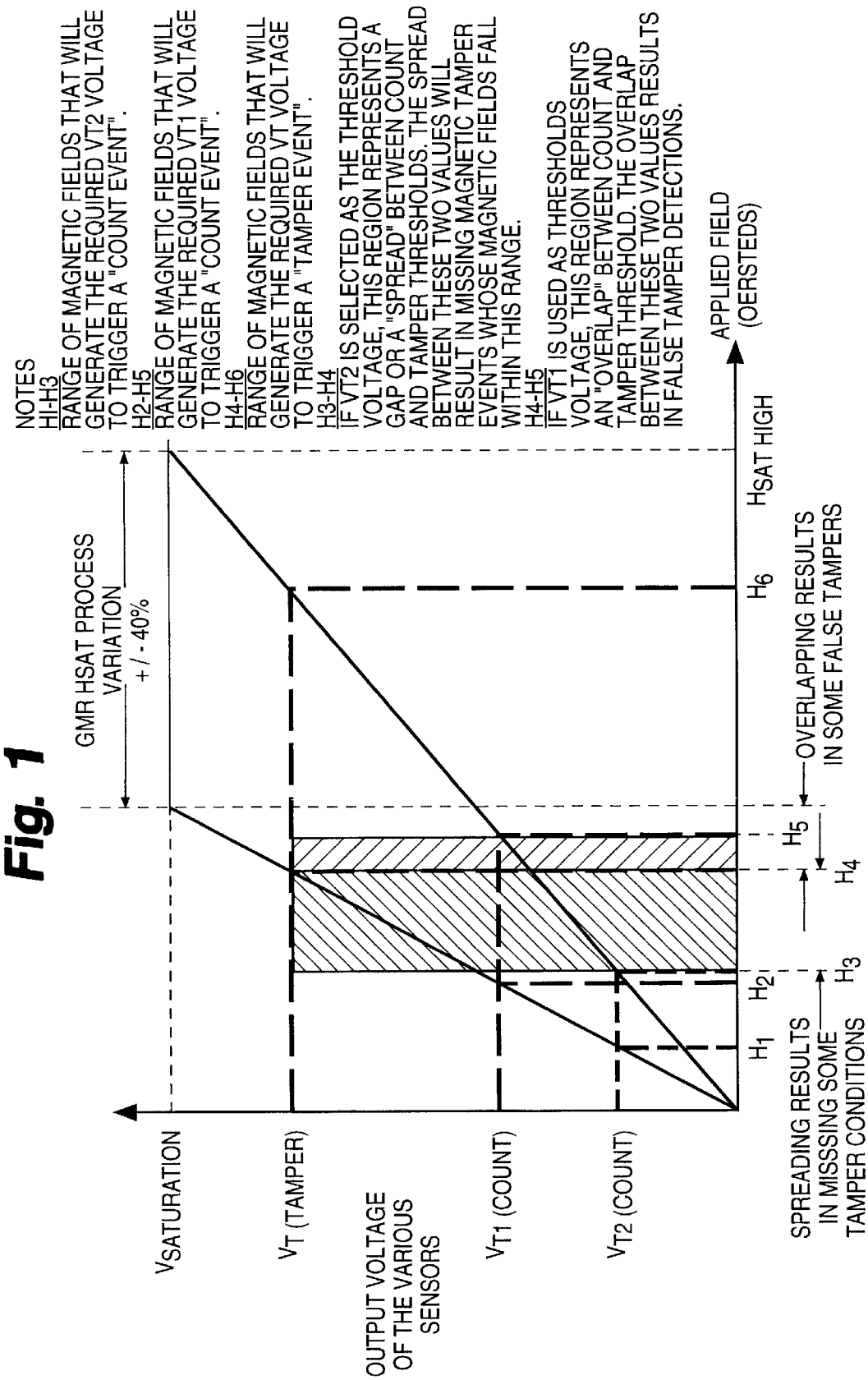
FIG. 1 is a graph of prior art count and tamper detectors with overlapping tolerances that give rise to false tamper detections.
Figure 2:
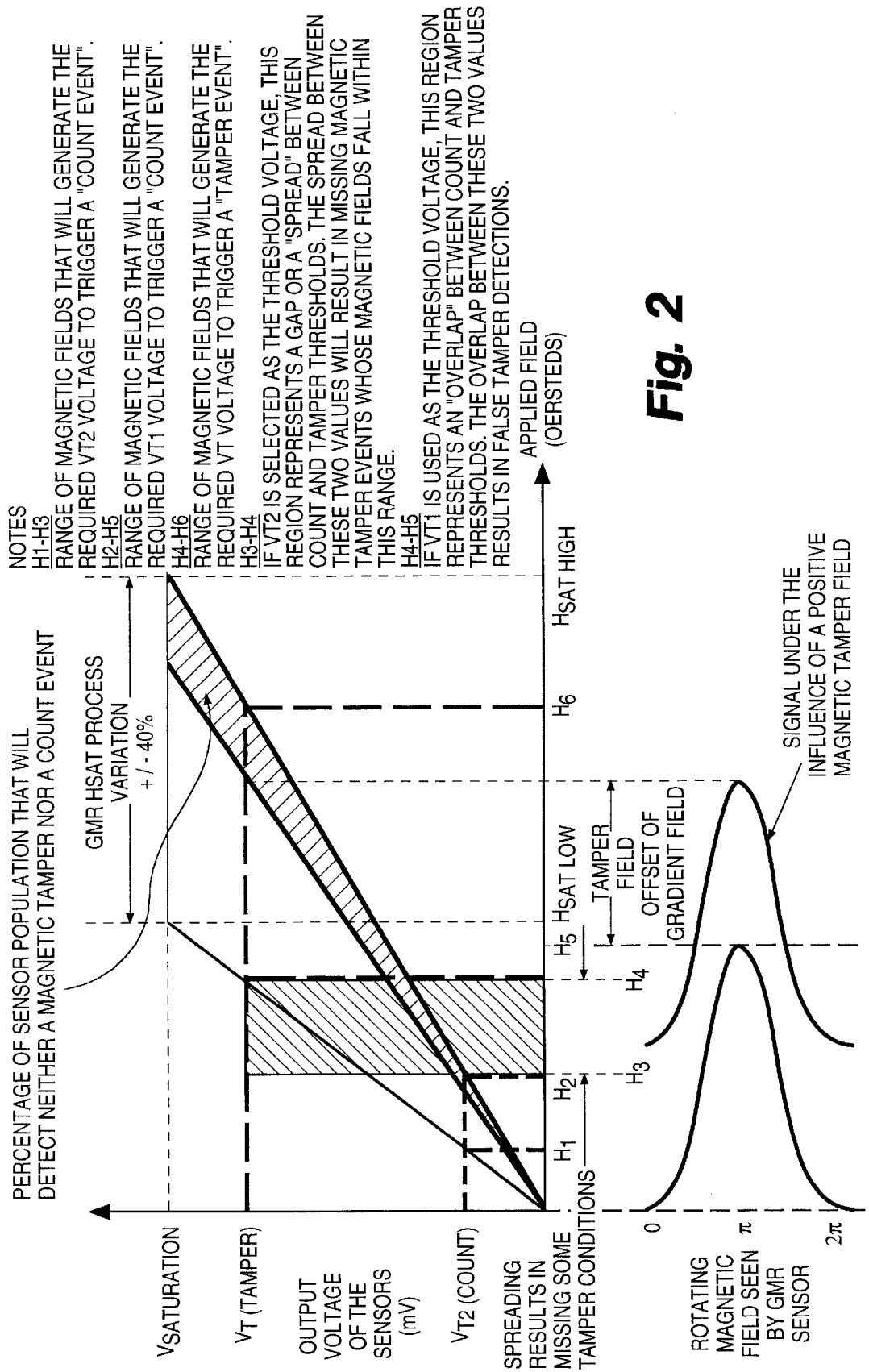
FIG. 2 is a graph of prior art count and tamper detectors wherein the ranges of the count and tamper detectors are spread apart giving rise to actual tampers not being detected.
Figure 3A:
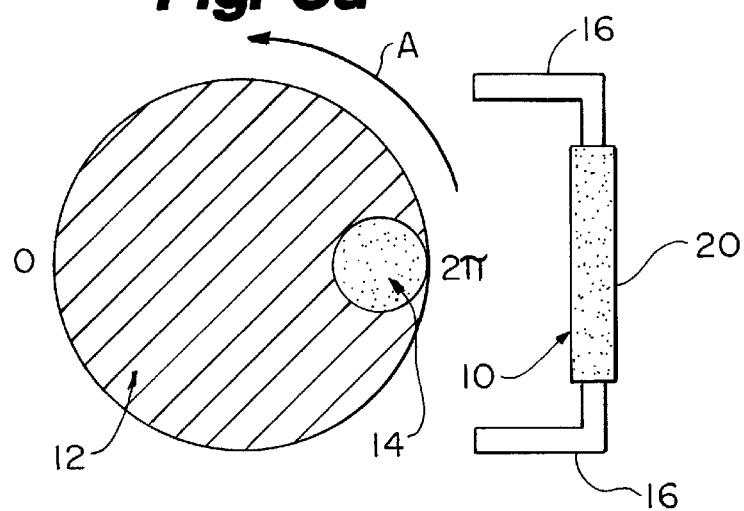
FIG. 3a is a top planform view of the count and tamper sensor assembly of the present invention disposed proximate a section of the rotating shaft of the meter with a magnet embedded therein.
Figure 3B:
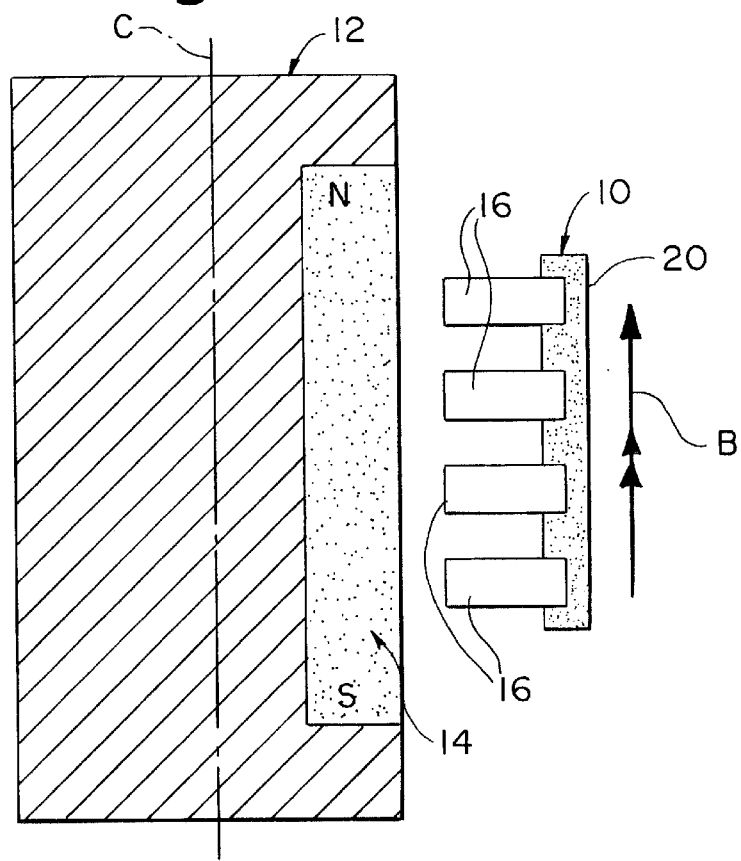
FIG. 3b is a side elevational view of the count and tamper sensor assembly of the present invention disposed proximate the rotating shaft of the meter with a magnet embedded therein.

The sensor assembly of the present invention is shown generally at 10 in the Figures. In FIGS. 3a, 3b the sensor assembly 10 is depicted in relationship to a rotating shaft 12. The rotating shaft 12 has a magnet 14 imbedded therein. Rotation of the magnet 14 results in an energy gradient as depicted at 18 in FIG. 2 to be sensed by the sensor assembly 10 as the rotating shaft 12 rotates through 2π revolutions or 360° of revolution. Revolution of the shaft 12 is indicated by arrow A. Each passage of the energy gradient 18 is detected as a count by the sensor assembly 10. The depicted magnet 14 is formed in an elongate structure. With such elongate structure, the sensor assembly 10 may be advantageously placed biased toward one or the other of the two poles of the magnet 14. With a magnet 14 having a more compact structure, the sensor assembly 10 may be advantageously placed equidistant from the two poles of the magnet 14.

The sensor assembly 10 has leads 16 coupled to a sensor body 20. The leads 16 are designed to be mounted by robotic auto-placement in a surface mount on a circuit board. The leads 16 may be flow soldered by known methods to conductive strips embedded in the circuit board. A sensitivity axis depicted as arrow B is parallel to the long axis of the sensor assembly 10. The sensor assembly 10 is disposed with respect to the shaft 12 such that the sensitivity axis B is parallel with the longitudinal axis (the rotational axis) C of the shaft 12 and is normal or orthogonal to a plane of gradiation of the spatially varying magnetic field that results from the rotation of the magnet 14 as the spatially varying magnetic field is seen by the sensor assembly 10.

As will be described, the sensing of the energy gradient requires that at least two sensors be spaced apart so that there is a potential difference between the two sensors as the gradient is sensed. Accordingly, the sensitivity axis B is coincident with or parallel to a line drawn between the two spaced apart sensors that comprise the energy gradient detector.

Referring to FIG. 4, the sensor assembly 10 is depicted mounted on a substrate 26. The substrate 26 is preferably formed of a silicon material. Many hundreds of sensor assemblies 10 may be simultaneously formed on a single wafer formed of the material of substrate 26 by known methods. The single wafer may be six to eight inches in diameter. After such formation, the many sensor assemblies 10 formed thereon are cut from the substrate wafer to form the individual sensor assemblies (chips) 10 as depicted in FIG. 4. Since each sensor assembly 10 is formed integrated in a single chip that includes all the necessary detectors for count and tamper detection integrated thereon, all the necessary detectors the are formed at substantially the same radial displacement from the target point (geometric center) on the wafer. Accordingly, the tolerances of all the individual detectors formed on the substrate 26 are substantially the same. In this way the manufacturing yield of the sensor assemblies 10 of the present invention is substantially increased as compared to the past practice of forming the individual detrectors singly on a dedicated chip and later randomly selecting a group detectors to form the count and tamper sensor. Such random selection resulted in an unacceptably low yield due to the fact that the sensors being randomly selected for inclusion in a count and tamper sensor resulted in the count and tamper sensor consisting of a number of detectors having widely varying tolerances. With the present invention, the individual detectors are no longer randomly selected for inclusion in a certain count and tamper sensor assembly since the detectors are formed integrally on a single chip.

Sensor assembly 10 preferably has an elongate rectangular planform. The preferred dimensions of the sensor assembly 10 are less than 200 mils by 40 mils. In a preferred embodiment, the dimensions of the sensor assembly 10 are about 100 mils by 20 mils, although sensor assemblies 10 have been reliably demonstrated to perform the count and tamper detection functions that are 50 mils by 10 mils.

A count detector 28 and a tamper detector 30 are integrally formed on the substrate 26. As previously indicated, being in such close proximity during the formation process ensures that the individual sensors comprising the count detector 28 and the tamper detector 30 have substantially the same performance characteristics, including the same sensitivities and saturation point. This represents a significant departure from previous count and tamper detectors where the individual sensors making were formed at random locations on the silicon wafer and then selected to form the count detector 28 and the tamper detector 30.

In the embodiment of FIG. 4, there are four count sensors 32–35, labeled G1–G4 (indicating that the sensors 32–35 form a gradiometer) in the figure. In the embodiment of FIG. 4, the count sensors 32–35 are GMR sensors. It is understood that other sensors responsive to the type of energy to be sensed may be employed as well. Such sensors include photosensors in the presence of a light energy field and Hall effect sensors in the presence of a magnetic field. The count sensors 32–35 are communicatively coupled by connecting strips 36 formed on the substrate 26.

It should be noted that the first pair of count sensors 32, 33 are spatially displaced from the second pair of count sensors 34, 35 along the long axis of the sensor assembly 10. Such spacial separation is necessary in order to sense the gradient of the energy field in order to detect a count. The sensitivity axis B then is parallel to the longitudinal axis of the sensor assembly 10. The count sensors 32–35 are communicatively coupled by the connecting strips 36 in a bridge arrangement. It is also possible to use a single count sensor spatially displaced from a second count sensor and communicatively coupled therewith in series circuit arrangement, although the bridge arrangement has been shown to be more sensitive to energy gradients.

There are five bonding pads formed on the sensor assembly 10. The bonding pads are ground pad 38, count pad 40, tamper pad 42, power pad 44 and sample pad 46. The bonding pads 38–46 are communicatively coupled to the count detector 28 and tamper detector 30 by the connecting strips 36 as indicated. Each of the bonding pads 38–46 is communicatively coupled to a lead 16 as depicted in FIGS. 3a, 3b. The count pad 40 is communicatively coupled by connecting strips 36 to count sensors 32 and 35.

There are two tamper sensors 50, 51. In the embodiment depicted in FIG. 4, the tamper sensors 50, 51 comprise a magnetometer and are labeled M1 and M2. As indicated above, the tamper sensors 50, 51 can be other types of sensors responsive to the particular type of static tamper energy field as long as one of the tamper sensors 50, 51 is shielded from the tamper field while the other of the tamper sensors 50, 51 is exposed to the tamper field. The tamper sensors 50, 51 are preferably GMR sensors in one embodiment. It should be noted that the six sensors comprising the count sensors 32–35 and the tamper sensors 50, 51 are identical.

Shield 52 is formed over tamper sensor 50. Shield 52 is preferably formed of a Permalloy material. The Permalloy shield 52 may have an affect on the flux lines of the tamper field. Accordingly, the preferred disposition of the tamper sensor 50 with respect to the count sensors 32–35 is equidistant from each of the count sensors 32–35 or centrally disposed with respect to the count sensors 32–35. Such disposition results in whatever affect the shield 52 has on the flux lines of a tamper field being equally felt by each of the count sensors 32–35. Accordingly, by positioning the shield 52 at the geometric center of the count sensors 32–35, no flux gradient that may be sensed by the count sensors 32–35 is generated by the shield 52.

The tamper detector 30 is connected in series with the power pad 44 and the ground pad 38. A tamper detection is taken from the tamper pad 42, the tamper pad 42 being communicatively to a connecting strip 36 extending between two of the contacts of the tamper sensors 50, 51.

Referring to FIG. 5, the gradiometer comprising the count detector 28 is wired in a parallel configuration with the magnetometer comprising the tamper detector 30. A tamper comparator 54 is communicatively coupled to both the tamper pad 42 and the sample pad 46. A count comparator 56 is communicatively coupled to both the count pad 40 and the sample pad 46. The sample signal available from the sample pad provides a reference against which the count signal from count pad 40 and the tamper signal from tamper pad 42 are compared to generate a tamper output from the tamper comparator 54 and a count output from the count comparator 56.

Figure 8:
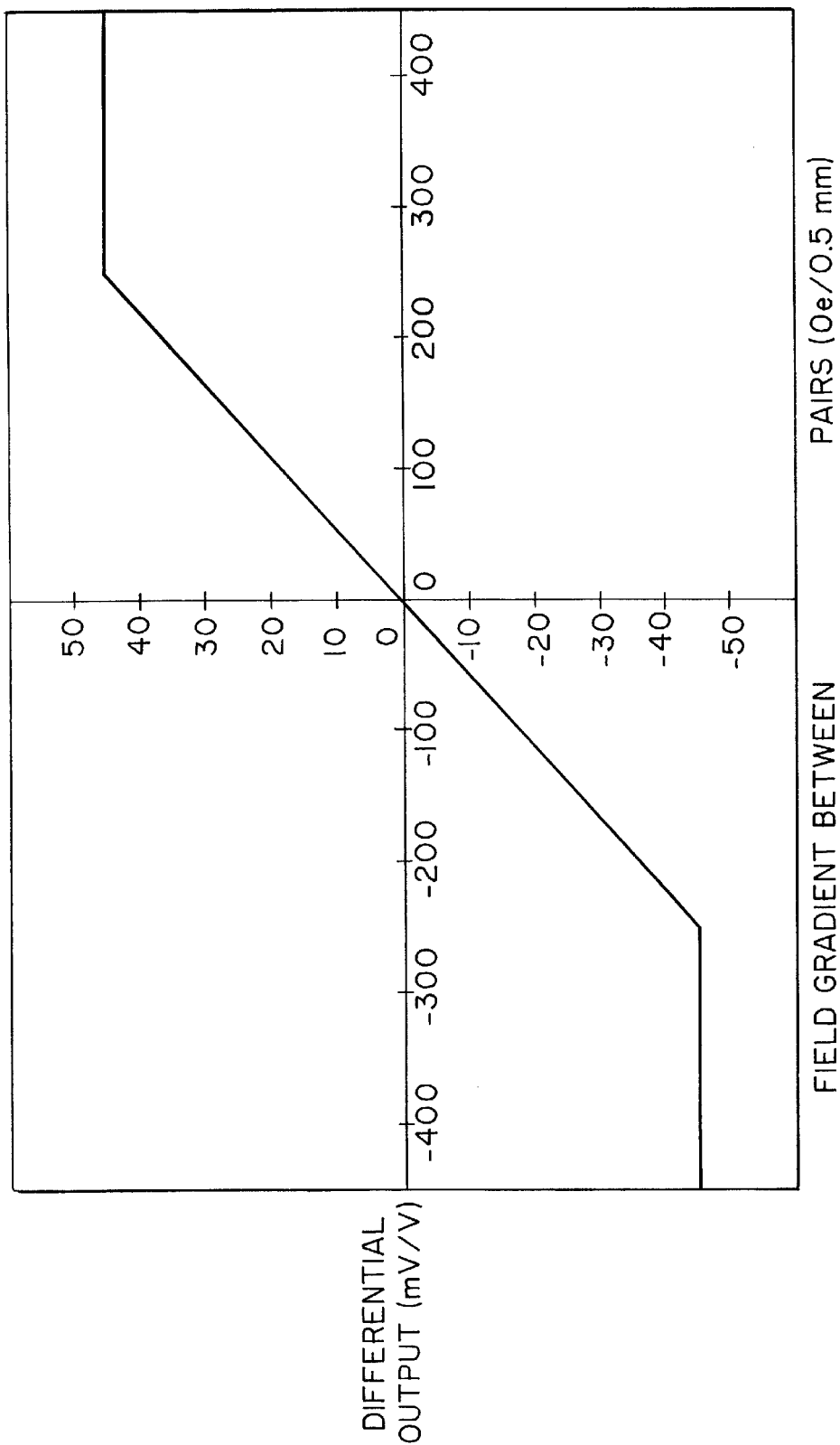
FIG. 8 is a graphic depiction of a gradiometer output with respect to the field gradient along the sensitivity axis between sensor pairs.

In the embodiment depicted in FIGS. 4 and 5, the count detector 28 is a GMR bridge. The GMR bridge of the present invention is a "gradiometer" type bridge. A gradiometer is sensitive only to fluctuating energy fields as distinct from static energy fields, as depicted in FIG. 8, although the gradiometer will saturate in the presence of a static energy field that is greater than the saturation point of the gradiometer. The sensor pairs indicated on the abscissa of the graph are count sensors 32, 33 as a first pair and count sensors 34, 35 as a second pair. As indicated in the graph at the origin there is no field gradient between the sensor pairs and no differential output. This corresponds to a situation where there is an energy gradient, but the two pairs of count sensors 32, 33 and 34, 35 are disposed so close together that no gradient is sensed. This is also the case where a static energy field is equally affecting each of the count sensors 32–35.

The depicted GMR gradiometer, comprising the count detector 28 is sensitive to a spatially varying magnetic energy, in the present embodiment, a rotating magnetic field. The count detector 28 is insensitive to a static magnetic field up until the static magnetic field equals or exceeds the saturation point of the count detector 28. Accordingly, the count detector 28 continues to count shaft 12 rotations by sensing the fluctuating magnetic field generated by the rotating magnet 14 embedded in the shaft 12, even in the presence of a static magnetic field, provided that the static magnetic field is less than the saturation magnetic field of the count detector 28.

The tamper detector 30 of the depicted embodiment of the present invention is a magnetometer type device that responds to both static fields and to fluctuating (spatially varying) fields. The sensors 32–35 and 50, 51 of the sensor assembly 10 of a preferred embodiment of the present invention operate in the range of approximately 35 to 500 gauss.

As previously indicated, sensors suitable for use as count and tamper sensors of the present invention may have a wide range of sensitivity if selected at random from a number of similarly manufactured sensors. Accordingly, a sensor that nominally saturates at a given field strength, for example 300 Gauss, typically has a sensitivity range plus or minus 40% as a result of manufacturing variances. Accordingly, such sensor may saturate at any point between 180 and 420 Gauss in the example. Advantageously, because all the sensors 32–35 and 50, 51 of the sensor assembly 10 of the present invention are deposited on the same integrated circuit structure, the tolerance for sensitivity of both the gradiometer, comprising the count detector 28, and the magnetometer, comprising the tamper detector 30, have the common characteristic that both will have substantially the same saturation magnetic field. Accordingly, for example, if the gradiometer (count detector 28) of a particular sensor assembly 10 saturates at 180 Gauss, the magnetometer (tamper detector 30) of the particular sensor assembly 10 will also saturate at 180 Gauss. If the gradiometer (count detector 28) of a particular sensor assembly 10 saturates at 420 Gauss, the magnetometer (tamper detector 30) of the particular sensor assembly 10 will also saturate at 420 Gauss.

This common characteristic is utilized advantageously in the sensor assembly 10 of the present invention. Referring to FIG. 6, the situation is presented, for example, in which both the gradiometer and the magnetometer saturate at 180 Gauss. A constant tamper threshold voltage is selected on the vertical axis. Above that threshold, the magnetometer will indicate a tamper voltage has been detected. Since the gradiometer does not respond to a static magnetic field, the gradiometer continues to accurately count in the region of between 160 and 180 Gauss. In this same region, the magnetometer is also detecting a tamper condition. At 180 Gauss both the magnetometer and the gradiometer saturate. In the saturated condition, no effective count and tamper detection signals are available from the meter.

FIG. 7 depicts the other extreme in sensitivity or tolerance of the magnetometer and the gradiometer. As depicted in FIG. 7, both the magnetometer and the gradiometer saturate at 420 Gauss. The tamper threshold selected is the same in FIG. 7 as was selected in FIG. 6. The gradiometer again accurately counts between zero and its saturation point at 420 Gauss. The magnetometer, on the other hand, detects a tamper at approximately 350 Gauss field strength. In the range between 350 Gauss and 420 Gauss, the magnetometer is detecting a tamper condition and at the same time the gradiometer is continuing to count accurately. With the overlap indicated in both FIGS. 6 and 7, all tamper situations are detected and no false tamper indications are generated.

In operation, the sensor assembly 10 of the present invention is disposed with respect to an energy gradient as indicated in FIGS. 3a and 3b. As the shaft 12 in FIG. 3a rotates, the sensor assembly 10 is exposed to an energy field having a bell shaped gradient as indicated in FIG. 2. Due to the rotation A of the shaft 12, the increasing gradient of the energy field is sensed first by count sensors 34, 35. A differential in field strength as sensed by sensors 34, 35 and the field strength as sensed by sensors 32, 33 is detected as a count. The differential in field strength that exists between the sensor pairs 34, 35 and the sensor pairs 32, 30 is as indicated in FIG. 8.

Assuming that the energy gradient sensed by the gradiometer count detector 28 is a magnetic field, it will be a tamper static magnetic field that is typically applied in order to try to defeat the counting. Because the sensor assembly 10 is so small, all the flux lines from an imposed tamper static field appear to the sensor assembly 10 as if they have their origin at infinity. Accordingly, all the sensors that comprise both the count detector 28 and the tamper detector 30 see the same static tamper field. Since all account sensors 32–35 are exposed to the same static tamper field, no differential between the sensor pairs 32, 33 and 34, 35 is generated by the static tamper field and therefore the count detector 28 does not detect a count. The effect of the imposed static tamper field on the count sensors 32–35 is to shift the energy gradient to the right as indicated in FIG. 2. Under such conditions, the count detector 28 continues to accurately count the fluctuations in the energy field gradient up until the point that the imposed static tamper field is greater than the saturation point of the count sensors 32–35.

As previously indicated, the shield 52 on the tamper sensor 50 may cause a flux imbalance in the flux lines emanating from the static tamper field. Such an imbalance could generate a differential between the count sensor pairs 32, 33 and 34, 35. By placing the tamper sensor 50 and the shield 52 in the geometric center of the count sensors 32–35, it is ensured that any flux in balance caused by the shield 52 is equally sensed by each of the count sensors 32–35. Accordingly, no energy field differential is caused thereby which may result in a false count.

The invention is not to be taken as limited to all of the details thereof as modifications and variations thereof may be made without departing from the spirit or scope of the invention.

We claim:

1. In a meter having a spatially varying magnetic field, the spatially varying magnetic field varying with respect to source and being related to a count of usage of a metered product, a sensor for sensing count and tamper, comprising:
   a count sensor disposed proximate the source of the spatially varying magnetic field for the detection of gradiations of the spatially varying magnetic field, said count sensor being substantially unaffected by a static magnetic field over a certain range of field strength; and
   a tamper sensor disposed proximate the count sensor within the spatially varying magnetic field for the detection of a tampering static magnetic field applied external to the meter.

2. A sensor as claimed in claim 1 wherein the count sensor and the tamper sensor are formed integrated in a single semiconductor circuit disposed on a single chip.

3. A sensor as claimed in claim 1 wherein the count sensor counts gradiations of the spatially varying magnetic field even in the presence of a tampering static magnetic field.

4. A sensor as claimed in claim 3 wherein the count sensor counts gradiations of the spatially varying magnetic field even in the presence of a tampering static magnetic field having a strength of between approximately 35 and 500 gauss.

5. A sensor as claimed in claim 3 wherein the count sensor has a certain saturation point defined as a certain field strength of a static magnetic field, the count sensor counting gradiations of the spatially varying magnetic field in the presence of a tampering static magnetic field having a strength of up to the saturation point of the count sensor.

6. A sensor as claimed in claim 1 wherein the count sensor and the tamper sensor exhibit giant magnetoresistive ratio characteristics.

7. A sensor as claimed in claim 5 wherein the count sensor has a sensitivity axis along which the count sensor is sensitive to a spatially varying magnetic field, the count sensor being so disposed with respect to the source of the spatially varying magnetic field that the orientation of the sensitivity axis is normal to a plane of gradiation of the spatially varying magnetic field.

8. A sensor as claimed in claim 7 wherein the count sensor is a gradiometer type sensor, being sensitive to dynamic magnetic fields having a gradiation and not being sensitive to a static magnetic field having a field strength that is less than a known saturation point of the count sensor.

9. A sensor as claimed in claim 5 wherein the count sensor and the tamper sensor each has a saturation point at a specific field strength, the saturation point of the count sensor and the tamper sensor being substantially equal.

10. A sensor as claimed in claim 9 wherein the count sensor and the tamper sensor are each integrated in a single semiconductor circuit, being formed integral on a single chip.

11. A sensor as claimed in claim 1 wherein the spatially varying magnetic field is caused by a magnet imbedded proximate the circumference of a rotating shaft, the count sensor being disposed spaced apart from and proximate the magnet at a point of closest approach of the magnet with respect to the sensor.

12. A sensor as claimed in claim 11, the magnet rotating in a plane of rotation, wherein the count sensor has a sensitive axis, the sensitive axis being disposed in an orthogonal relationship with respect to the plane of rotation of the magnet.

13. A sensor as claimed in claim 1 wherein the count sensor has a count range of magnetic field strengths in which a count is detected thereby and the tamper sensor has a tamper range of magnetic field strengths in which a tamper is detected thereby, the count range of magnetic field strengths and the tamper range of magnetic field strengths being substantially overlapped.

14. A sensor as claimed in claim 1 further comprising processor means being communicatively coupled to the count sensor for receiving communication therefrom related to consumption of the metered product and being communicatively coupled to the tamper sensor for receiving communication therefrom related to a tamper static magnetic field.

15. A sensor as claimed in claim 14 further comprising transmitting means being communicatively coupled to the processor means for receiving communication therefrom related to an electrical energy consumption and to a tamper static magnetic field, the transmitting means transmitting signals responsive to said communication to an external receiver, said signals being related to the electrical energy consumption and to the tamper static magnetic field.

16. A sensor as claimed in claim 15 wherein the transmitting means transmits said signals by means of radio frequency transmission through the atmosphere.

17. A sensor as claimed in claim 15 wherein the transmitting means is operably coupled to a telephone line and transmits said signals by means of transmission through said telephone line.

18. A method of detecting a spatially varying magnetic field in a meter, the meter for metering a commodity consumption, the spatially varying magnetic field having an origin and varying about an axis, the axis being displaced from the origin of the spatially varying magnetic field, comprising the steps of:

disposing a gradiometer type sensor spaced apart from and proximate the origin of the spatially varying magnetic field, the sensor having a sensitivity axis ,the sensitivity axis being substantially normal to plane of variation of the spatially varying magnetic field, such that the sensor senses a magnetic field gradient, said magnetic field gradient being related to the commodity consumption; and disposing a magnetometer type sensor proximate the gradiometer type sensor to sense the presence of an externally applied static magnetic field, said static field being imposed to tamper with the sensing of the commodity consumption.

19. The method of claim 18 further including the step of overlapping a count range of magnetic field strengths in which a count is detected by the gradiometer type sensor and a tamper range of magnetic field strengths in which a tamper is detected by the magnetometer type sensor.

20. The method of claim 19 further including the step of disposing the magnetometer type sensor proximate the gradiometer type sensor such that the magnetometer type sensor and the gradiometer type sensor are influenced by substantially the same field strength of the externally applied static magnetic field.

21. The method of claim 20 further including the step of transmitting signals related to the sensed commodity consumption and to the sensed tamper static magnetic field.

22. The method of claim 21 further including the step of transmitting said signals by means of radio frequency transmission through the atmosphere.

23. The method of claim 22 further including the step of transmitting said signals by means of transmission through a telephone line.

24. A sensor as claimed in claim 14 wherein the metered product is selected from a list of products consisting of:

1. natural gas;
2. electrical energy; and
3. water.

25. A sensor assembly for sensing count and tamper, said count being related to an energy field having a gradient along an axis of sensitivity and said tamper being related to a static energy field where the energy comprising the static energy field is the same type as the energy comprising the energy field having a gradient, the sensor assembly comprising:

an energy gradient detector having at least a first sensor spaced apart from and communicably coupled to a second sensor along the axis of sensitivity; and a static energy detector having at least a first shielded sensor, the shielded sensor being substantially shielded from the energy field having a gradient and from the static energy field, and a second unshielded sensor being communicably coupled to said shielded sensor.

26. The sensor assembly of claim 25 wherein the energy gradient detector and the static energy detector are formed on the same integrated circuit structure.

27. The sensor assembly of claim 26 wherein the integrated circuit structure has a length and a width dimensions, the length dimension being less than 200 mils and the width dimension being less than 40 mils.

28. The sensor assembly of claim 25 wherein the energy gradient detector and the static energy detector have the characteristic of saturating at substantially the same strength of the energy field.

29. A method of forming a sensor assembly for sensing count and tamper, said count being related to an energy field having a gradient along an axis of sensitivity and said tamper being related to a static energy field where the energy comprising the static energy field is the same type as the energy comprising the energy field having a gradient, the method comprising the steps of:

providing a substrate;

forming a first count sensor for sensing count on said substrate;

forming a second count sensor for sensing count on said substrate, said second count sensor being spaced apart from said first count;

forming a communication path communicatively coupling said first count sensor to said second count sensor;

forming a first tamper sensor for sensing tamper on said substrate, said first tamper sensor being disposed centered with respect to said first and said second count sensors;

forming a shield over said first tamper sensor for shielding said first tamper sensor from the energy field;

forming a second tamper sensor for sensing tamper on said substrate; and forming a communication path communicatively coupling said first tamper sensor to said second tamper sensor.

* * * * *

UNITED STATES PATENT AND TRADEMARK OFFICE
CERTIFICATE OF CORRECTION

PATENT NO. : 5,910,774
DATED : June 8, 1999
INVENTOR(S) : Capriotti et al.

It is certified that error appears in the above-indentified patent and that said Letters Patent is hereby corrected as shown below:

Column 1, line 64, after "device" delete ",".

Column 2, line 2, delete "proximxity" and insert --proximity--.

Column 2, line 32, delete "form" and insert --from--.

Column 2, line 58, delete "on" and insert --in--.

Column 5, line 65, after "detectors" delete "the".

Column 6, line 5, delete "detrectors" and insert --detectors--.

Column 6, line 6, after "group" insert --of--.

UNITED STATES PATENT AND TRADEMARK OFFICE
CERTIFICATE OF CORRECTION

PATENT NO. : 5,910,774
DATED : June 8, 1999
INVENTOR(S) : Capriotti et al.

It is certified that error appears in the above-indentified patent and that said Letters Patent is hereby corrected as shown below:

Column 6, line 31, delete "making".

Column 11, line 9, delete "axis ,the" and insert --axis, the--.

Column 12, line 14, delete "dimensions" and insert --dimension--.

Signed and Sealed this

Twenty-third Day of November, 1999

Attest:

Attesting Officer

Q. TODD DICKINSON

Acting Commissioner of Patents and Trademarks